United States Patent [19]

Doherty et al.

[11] Patent Number: 4,627,005
[45] Date of Patent: Dec. 2, 1986

[54] EQUAL DENSITY DISTRIBUTION PROCESS

[75] Inventors: John P. Doherty, Haverhill; David L. Dufour, Wakefield, both of Mass.; Russell E. Gebo, Windham, N.H.; Michael J. Sullivan, Arlington, Mass.

[73] Assignee: Honeywell Information Systems Inc., Waltham, Mass.

[21] Appl. No.: 654,335

[22] Filed: Sep. 24, 1984

[51] Int. Cl.$^4$ .............................................. G03B 27/02
[52] U.S. Cl. ...................................... 364/525; 355/79; 355/132
[58] Field of Search .................. 355/40, 79, 77, 132, 355/133; 354/4, 5; 364/489, 519, 520, 525; 346/108

[56] References Cited

U.S. PATENT DOCUMENTS 4,571,072  2/1986  Bourbeau, Jr. et al. ......... 355/132 X

OTHER PUBLICATIONS

"Photographic Composite Generation"-IBM Technical Disclosure Bulletin, vol. 7, No. 7, 12/1964.

Primary Examiner—L. T. Hix
Assistant Examiner—Della Rutledge
Attorney, Agent, or Firm—Faith F. Driscoll; John S. Solakian

[57] ABSTRACT

A photograph artwork containing a one to one scale exact image of the circuit pattern to appear on a fabricated printed-wiring board is modified in a predetermined manner. This has the effect of equalizing the amount of metallic conductive circuits on a double sided printed wiring board or panel. The resulting board or panel is plated uniformly on both sides when passed through the electrodeposition cycle of a fabrication process.

23 Claims, 11 Drawing Figures

EQUAL DENSITY DISTRIBUTION PROCESS

BACKGROUND OF THE INVENTION

1. Field of Use

This invention relates to printed wiring boards and more particularly to systems and methods for fabricating such boards.

2. Prior Art

As is well known, printed wiring board designs are developed through the utilization of computer aided design (CAD) systems. These systems have interactive graphic and digitizing equipment used by a designer during the physical design and layout phases of a multilayer printed circuit board development.

Such CAD systems are used to provide a digitized output on a magnetic media. The output is in turn applied as an input to photoplotting equipment which generates the PWB artwork. The artwork is then used to fabricate the prototype or production version of the printed wiring board by employing well known photography and manufacturing steps.

It has been found that dissimilarities in the manufacturing steps or processes for fabricating double sided and multilayer printed wiring boards have given rise to problems in the amount of plating on both sides of a printed wiring board panel as it proceeds through the plating cycle. For example, in a panel plate operation/process, the panels are first drilled and then metal, such as copper, is deposited on both sides of the panel to the desired finish thickness. The artwork image is then photographically applied to or stenciled on the panel. The unwanted metal is etched away leaving the desired pattern.

By contrast, in a selective plating operation or pattern plate, a similar photographic stenciling operation is used. However, the pattern covers only those areas where metal is not desired. Since in selective plating all the plating is not done before image application, the circuit pattern densities are of less concern and can be relatively uncontrolled.

When you take circuit board design artworks developed for a panel plate operation to facilitate boards using a pattern plate process, significant plating unbalances result. One technique used to reduce such imbalances has been to take circuit pattern densities into account during the design phase. In addition to restricting the designer, it requires expenditure of extra effort to ensure circuit patterns are uniformly distributed adding to design complexity as well as manually lengthening the design phase.

Another technique has been to employ a method of unsystematic taping wherein tape is added to the sides of the boards to assist in the plating process. In addition to being very time consuming, in many cases the tape had to be removed to prevent the boards from becoming non-functional.

The above problems are further compounded by the number of boards which are being fabricated, as well as the number of layers. Each board type in many cases requires special handling by individual inspection and testing. The result is marked decreases in production throughput.

Accordingly, it is a primary object of the present invention to provide a method for facilitating the fabrication of printed wiring boards.

It is a further object of the invention to provide a method which increases production throughput and reduces both the design and fabrication cycle time.

It is still a further object of the invention to provide a system and method which permits high volume production for all types of boards at significant cost savings.

SUMMARY OF THE INVENTION

The above and other objects are achieved in a preferred embodiment which includes a computer aided design system operative to generate the circuit design patterns for an existing master artwork and an equal density distribution pattern. According to the invention, the equal density distribution master has a predetermined uniformly distributed repetitive pattern. In the preferred embodiment, it consists of an array or matrix of square spots of a predetermined size (e.g. 50 thousandths) on a grid of a predetermined size (e.g. 100 thousandths).

The CAD output is in turn applied to photoplotter equipment which produces a photographic master artwork containing the line representations of the existing printed wiring circuit design and a photographic master of the equal density distribution pattern. The design master artwork is enlarged or spread by a predetermined amount.

These two master artworks are photographically combined in a predetermined manner with the original unspread master artwork in double exposure operation. The result is that the original master artwork is modified to include the equal density distribution pattern in unused areas, so that when it is used during the fabrication process, it has the effect of equalizing the amount of metal circuit patterns plated on both sides of the printed wiring board or panel. This produces a uniform distribution of plating on both sides of the panel as it proceeds through the electro-deposition cycle of the fabrication process.

By ensuring uniform thickness, essentially independent of the particular type of printed wiring board design, essentially all board types can be fabricated as one board type. This optimizes production throughput, since all board types essentially undergo a standardized plating operation (i.e., use the same parameters, such as voltage settings). Additionally, the method of the present invention provides significant improvements during fabrication, such as marked improvements in two main areas, flow control during lamination and plating control. By improving flow control, there is a significant reduction in microvoids, uniformity in panel thickness, minimization in panel warp or twist and a large reduction in the potential for delamination. The improvements in plating control produce a balanced density of metal from quadrant to quadrant, side to side and from panel to panel.

The above provides uniformity in board impedance characteristics and improves board reliability in that it is unlikely to have connector failure caused by board warp and twist, since the boards have uniform thickness (i.e., flat rather than tapered). This consistency eliminates the need to subject boards to continuous inspection and testing.

The novel features which are believed to be characteristic of the invention both as to its organization and method of operation, together with further objects and advantages will be better understood from the following description when considered in connection with the accompanying drawings. It is to be expressly understood, however, that each of the drawings is given for the purpose of illustration and description only and is not intended as a definition of the limits of the present invention.

DESCRIPTION OF THE PREFERRED EMBODIMENT

Figure 1:
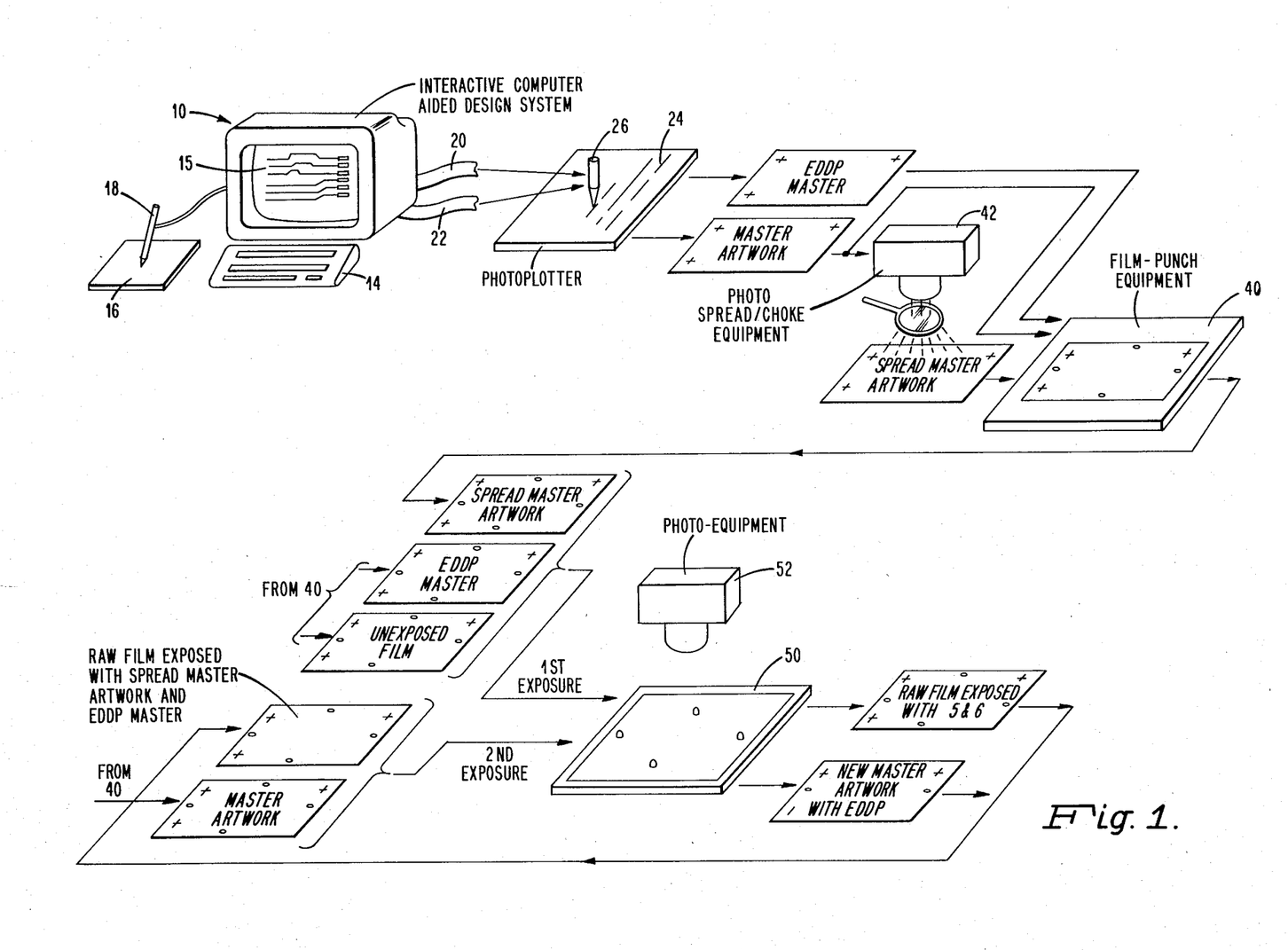
FIG. 1 is a flow diagram of a preferred embodiment of the system of the present invention.

FIG. 1 is a block diagram of the preferred embodiment of the system which utilizes the method of the present invention.

Referring to the Figure, it is seen that the system includes an interactive computer aided design (CAD) system 10. The system 10 is conventional in design and may, for example, take the form of the interactive graphics system manufactured by Applicon Incorporated.

As shown, the system 10 includes a graphics display terminal unit 12 which includes a keyboard 14 and a tablet 16 with associated electric pen 18. A designer can call up an existing source document such as an existing original master artwork. Also, the designer with electronic pen 18 and using the function keys, can generate and array of spots which cover the area of the artwork.

Through the use of function keys, the designer is able to specify parameters, such as sizes (width and length) of the spots which represent the equal density distribution pattern (EDPP) of the present invention. The system 10 operates to digitize all of the new information pertaining to the EDDP and outputs, the results of the existing design and EDDP separately on magnetic tape. In FIG. 1, the separation is illustrated by two magnetic tapes 20 and 22.

As seen from FIG. 1, the digitized design and EDDP information, produced on tapes 20 and 22, are applied as an input to a photoplotter 24. The photoplotter 24 by activating a photohead element 26 operates to plot the existing design and the EDDP on sheets of an appropriate photograpic plastic media (e.g. mylar film). The photoplotter 24 is conventional in design and may, for example, take the form of the Model 32B photoplotter manufactured by The Gerber Scientific Instrument Company.

The master artwork 34 is applied to photoghaphic equipment 42. This equipment enlarges or spreads the master artwork image by a predetermined amount as explained herein. The equipment can be considered conventional in design and may take the form of the Micro Modifier System, manufactured by Byers Corporation.

The resulting two masters 30 and 32 are applied to film punch equipment 40 along with the spread master artwork 34. The equipment 40 operates to accurately pierce four registration slots in each artwork film in relation to three crosshairs photoplotted on the artworks.

The equipment 40 includes a surface plate or table onto which a work plate, its pneumatic and electrical components and a manually operated precision X-Y motion system (not shown), are mounted. A microscope and camera system (not shown) is mounted on linear bearings above the surface plate on a support. The system microscopes are used to view two orthogonal (alignment) lines on glass plates which are rigidly fixed to the work plate.

The alignment of artwork on the work plate is accomplished by matching a crosshair plotted on the PWB artwork with a crosshair in a spindle or rotary chuck on the work plate. The chuck or spindle is then rotated until the two alignment crosshairs plotted on the PWB artwork coincide with the alignment lines. Vaccum/pneumatic components are used to hold the artwork flat and rigidly in place.

When alignment is completed, four dies positioned perpendicular to each other are actuated which operate to punch four slots having 0.1875 dimensions of ±0.0002 inches at predetermined locations on the artwork as graphically illustrated in FIG. 1. For the purpose of the present invention, this equipment is conventional in design and, for example, takes the form of equipment manufactured by Northeastern Tool Company, Inc.

The punched artworks 30, 32 and 34 are combined photographically in a series of steps on a pinned contact frame table 50. The contact frame table 50 is conventional in design and may, for example, take the form of the Model 64A contact printer manufactured by R. W. Borrowdale Company. Photoequipment 52 in the form of a light source provides the desired film double exposure required to produce the composite artwork required for the generation of a modified master artwork 36 containing the equal density distribution pattern, as explained herein. Also, the photoequipment 52 includes film developing apparatus conventional in design which is used to process the exposed film.

DESCRIPTION OF OPERATION

Now that the system of FIG. 1 has been generally described, the operation of this system in carrying out the process of the present invention will now be described in detail with reference to FIGS. 2 through 6.

It is assumed that the original master artwork must be modified, because if used in the fabrication cycle, it will produce unequal amounts of plating of a double-sided board or panel. As used herein, the term "artwork" refers to the image or topological layout of the conductor circuit pattern or printed wiring pattern of a printed wiring board on sheet film or glass or other plastic material.

Figure 3A:
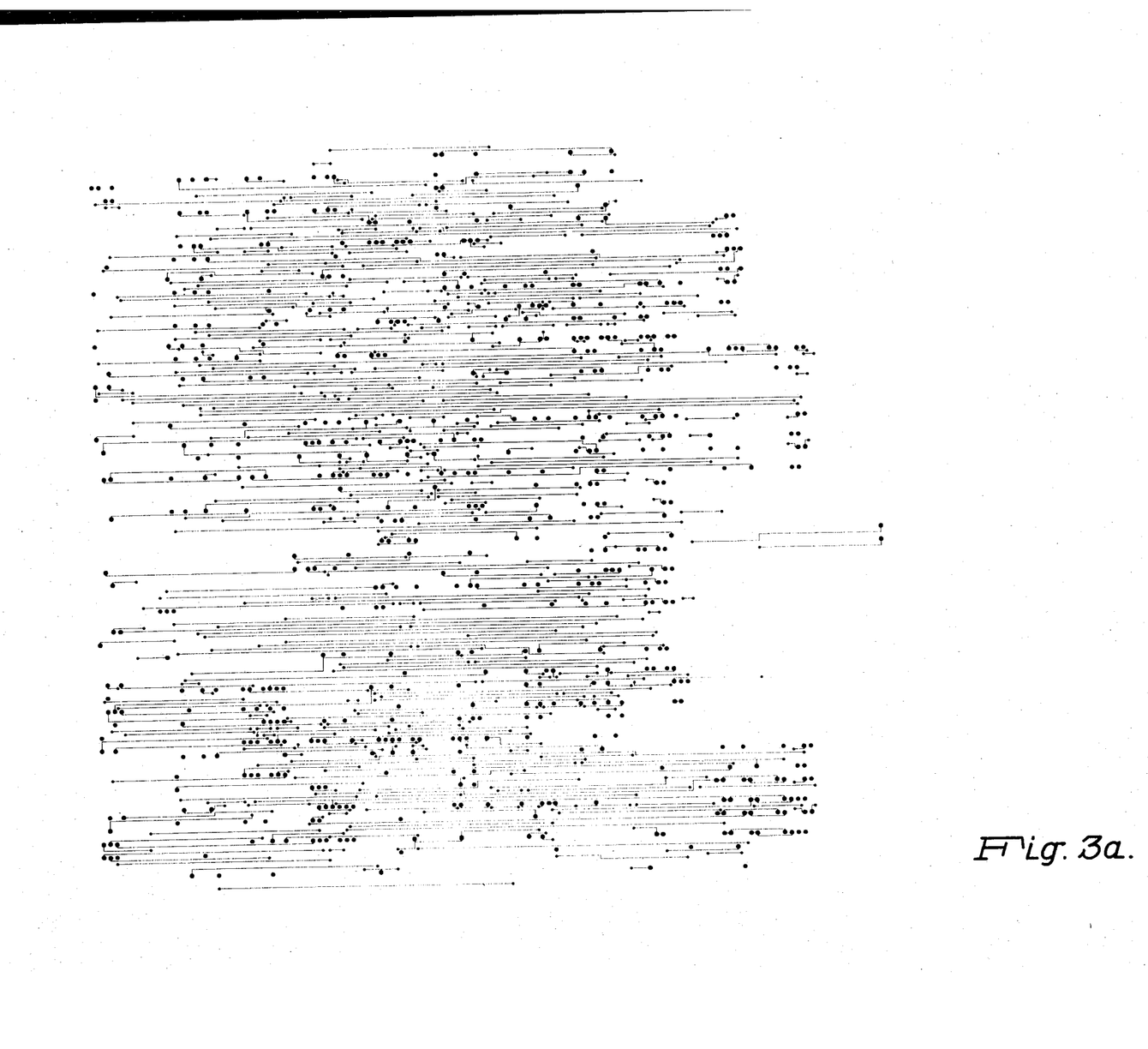
FIGS. 3a through 3f illustrate the different photographic artwork masters generated by the various steps shown in FIG. 2.
Figure 3B:
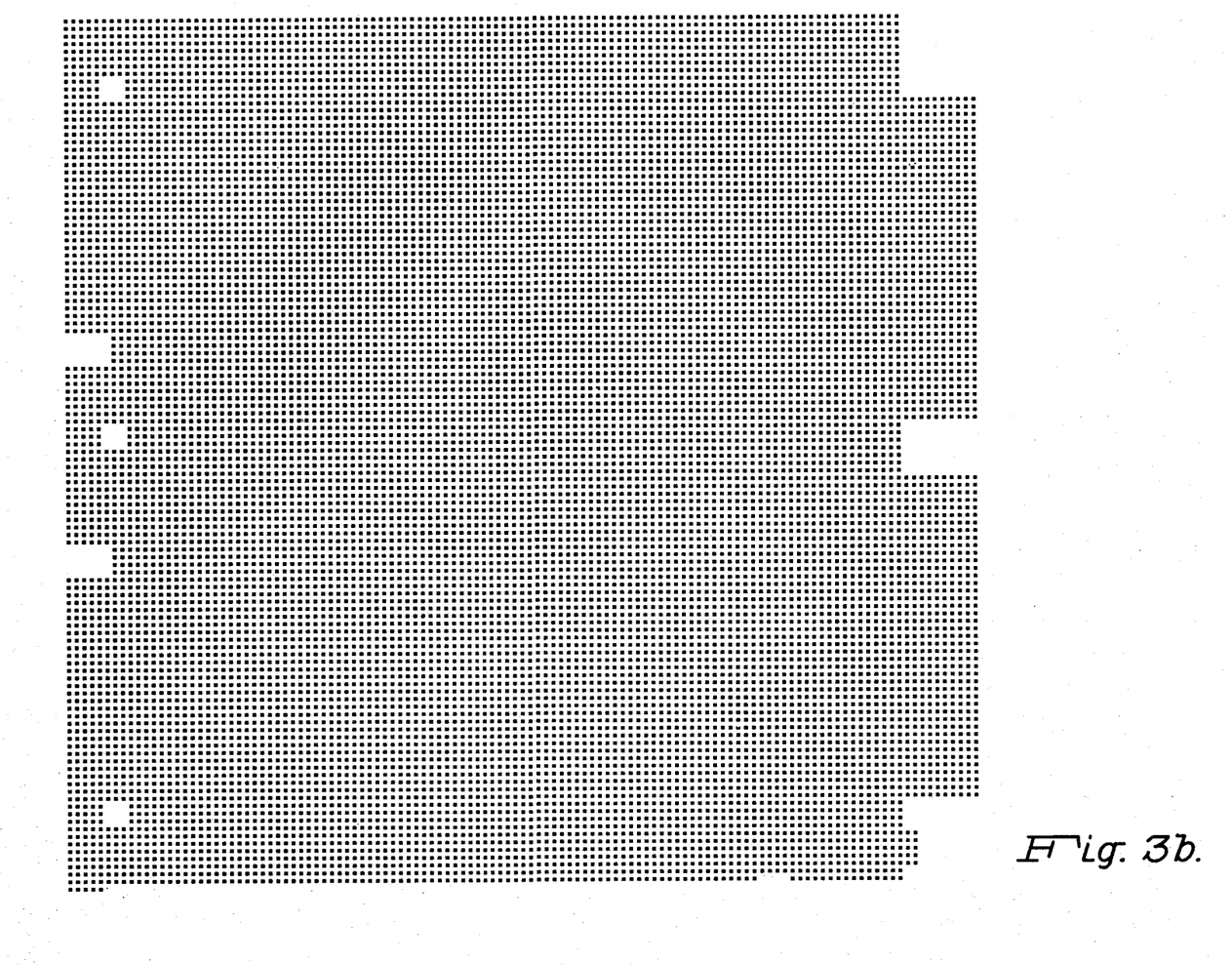
Figure 3C:
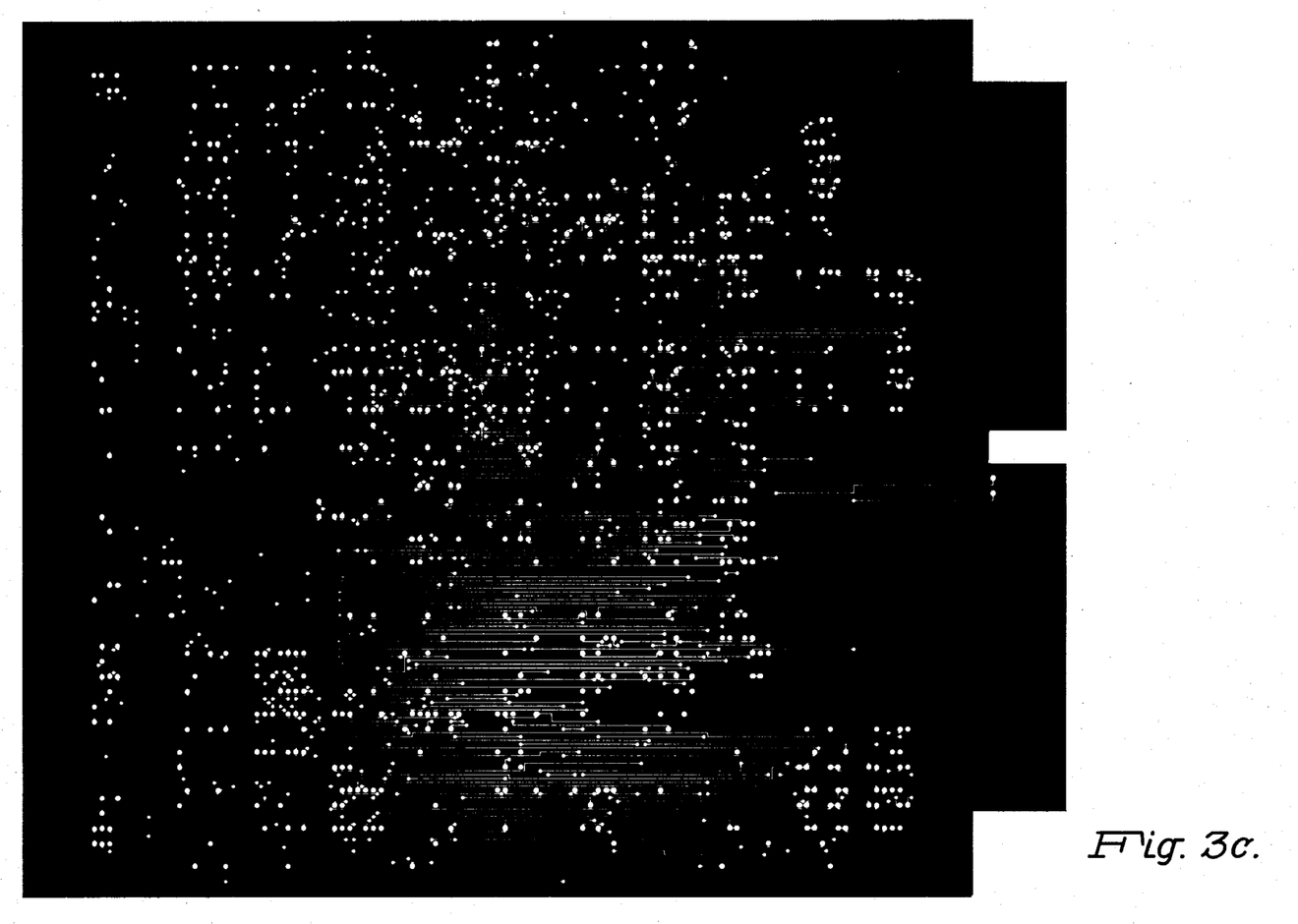
Figure 6:
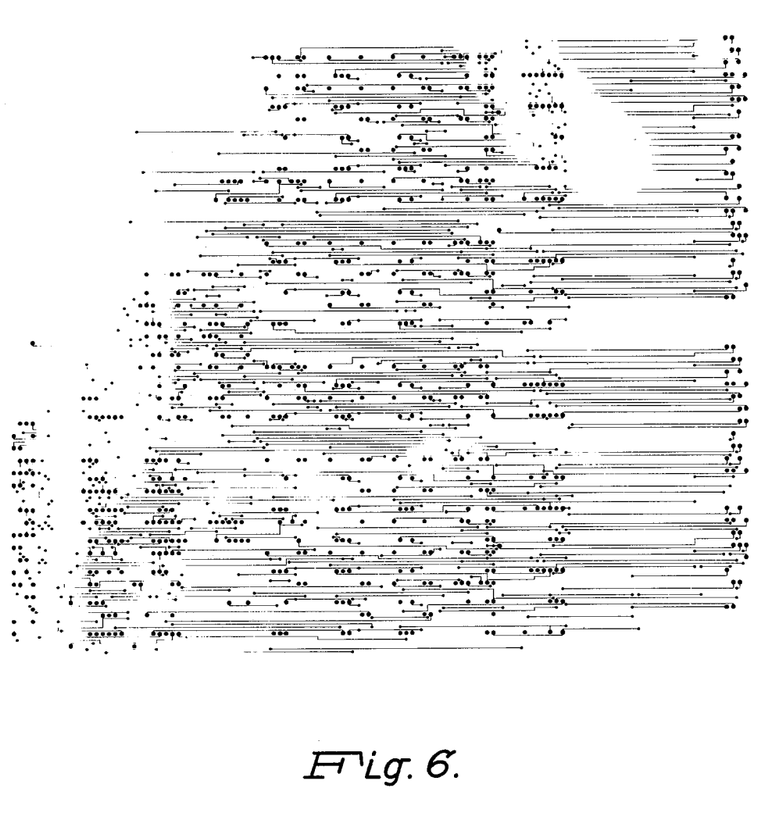
FIG. 6 shows a master artwork representative of an existing design used in describing the present invention.

In examining the original master artwork of FIG. 6 which is similar to FIG. 3a, it can be seen that its density varies considerably over the allocated usable area of the board. This area is normally divided into four quadrants. The circuit line density of the lower left quadrant is substantially less (i.e., two-thirds) than the density of the adjacent upper left quadrant, as well as the remaining two quadrants.

When you have that degree of dissimilarity between quadrants, the lower left quadrant of the board will overplate. That is, during the plating cycle of the fabication process, the same amount of current is applied to all areas of the entire board. You would need approximately only one-third the amount of current to plate the lower left quadrant as you need for the upper left quadrant. However, this area has two or three times as much current applied to it with the result that etch lines are burned or copper holes are filled. By contrast, the more dense areas of the board are being underplated.

Using such an artwork master for board fabrication produces the problems described above. The process of the present invention not only overcomes these problems, but improves board quality by improving the flow control during lamination and improves plating control. By improving flow control, microvoids are reduced significantly (i.e., approximately 93 percent), the panel thickness is made uniform permitting a reduction in the number of laminate sheets, panel warp is minimized making the boards more reliable and the resulting increase in the amount of metal plated onto the board decreases the potential for delaminations. The improved plating control produces a balanced density from quadrant to quadrant, side to side and panel to panel.

In a conventional manner, the designer using the CAD system 10 calls up the existing or original master artwork. Also, the designer using CAD system 10 creates the equal density distribution pattern. The pattern enlarged and shown in part in FIG. 5 consists of a matrix of fifty thousandths square spots on a one hundred thousandths grid. That is, the designer introduces into the system, X, Y coordinates of all of the pattern. Also, the designer designates the sizes or widths of the lines used to form the spots. The designer creates two separate files, one containing the existing design and the other containing the equal density distribution pattern.

The CAD system 10 operates to output the manually generated digital information onto two magnetic tapes 20 and 22 of FIG. 1. These tapes are applied to the photoplotter 24 of FIG. 2 which performs the photographic process of plotting on a first sheet of unexposed photographic mylar film, the lines of the existing design denoted by block 200 of FIG. 2. This results in producing the positive master artwork of FIG. 3a as denoted by block 202. Also, as part of block 200, photoplotter 24 plots on a second sheet of unexposed photographic mylar film, the equal density distribution pattern (EDDP) of FIG. 5 according to the present invention. This results in producing the EDDP positive master sheet 19 of FIG. 3b in FIG. 2, denoted by block 204.

Figure 2:
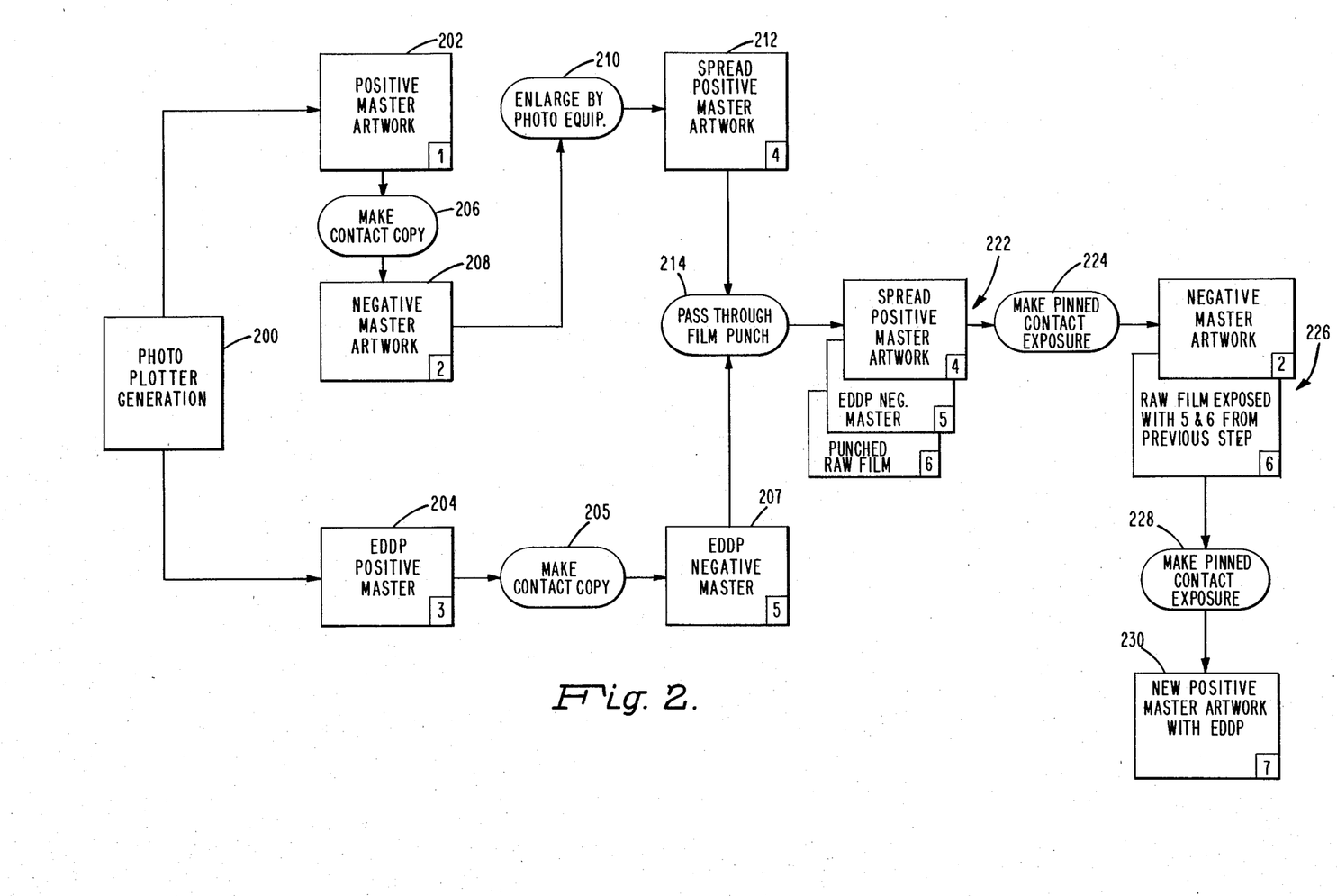
FIG. 2 is a block diagram illustrating the method performed by the system of FIG. 1.

As shown in blocks 202 and 208 of FIG. 2, a contact copy of the positive master artwork of FIG. 3a is made. More specifically, the positive master artwork is placed on contact table 50 over a sheet of unexposed mylar film. Conventional photoequipment exposes film and the master artwork image is developed on the mylar film by the photoequipment. The difference between the negative master artwork of FIG. 3c and the master artwork of FIG. 3a is that the negative master artwork has an opaque background and the circuit pattern is transparent (clear). This produces the negative master artwork (sheet 2 in FIG. 2) of FIG. 3c. The same operation is performed with the EDDP positive master of FIG. 3b (sheet 3 in FIG. 2). This is denoted by blocks 204 and 207 in FIG. 2 and produces the EDDP negative master of FIG. 3d (sheet 6 in FIG. 2).

Also, the image on the negative master artwork of FIG. 3 is enlarged by fifty thousandths of an inch using the photographic equipment 42 of FIG. 1. That is, the equipment spreads or expands the line image (etch) of the master artwork which produces the spread positive master artwork of FIG. 3e (sheet 4 in FIG. 2). This operation is denoted by blocks 210 and 212.

Figure 3D:
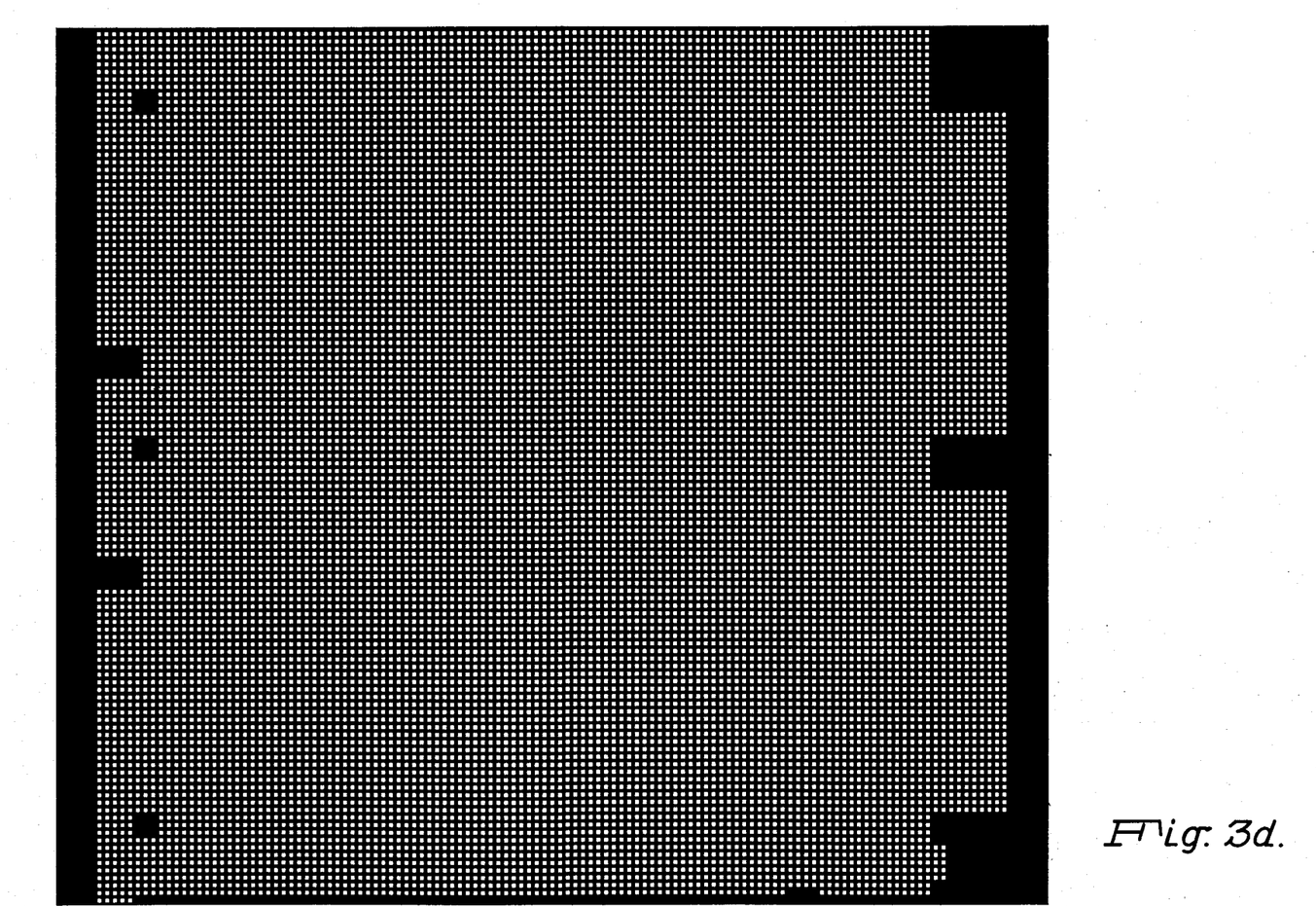
Figure 3E:
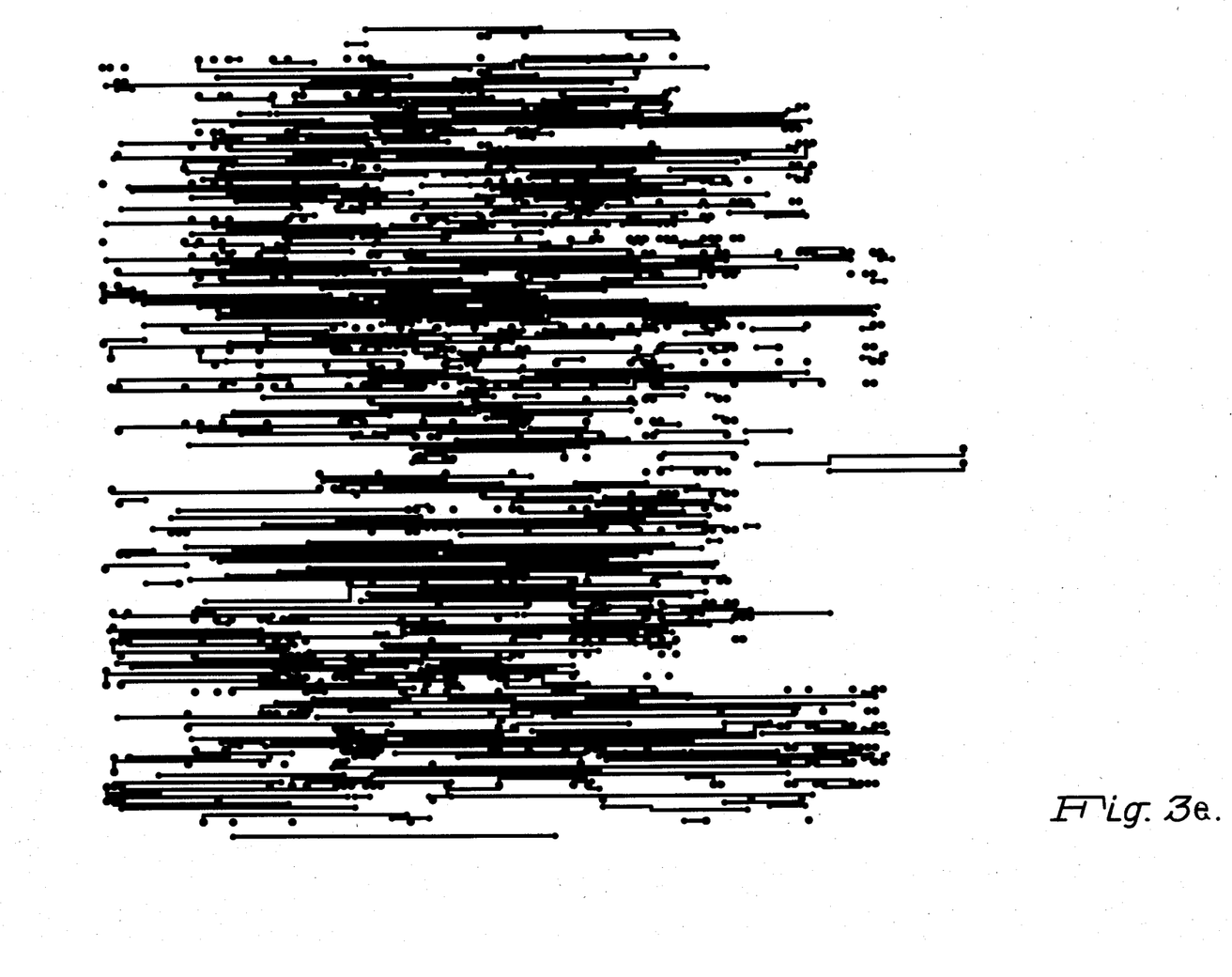
Figure 3F:
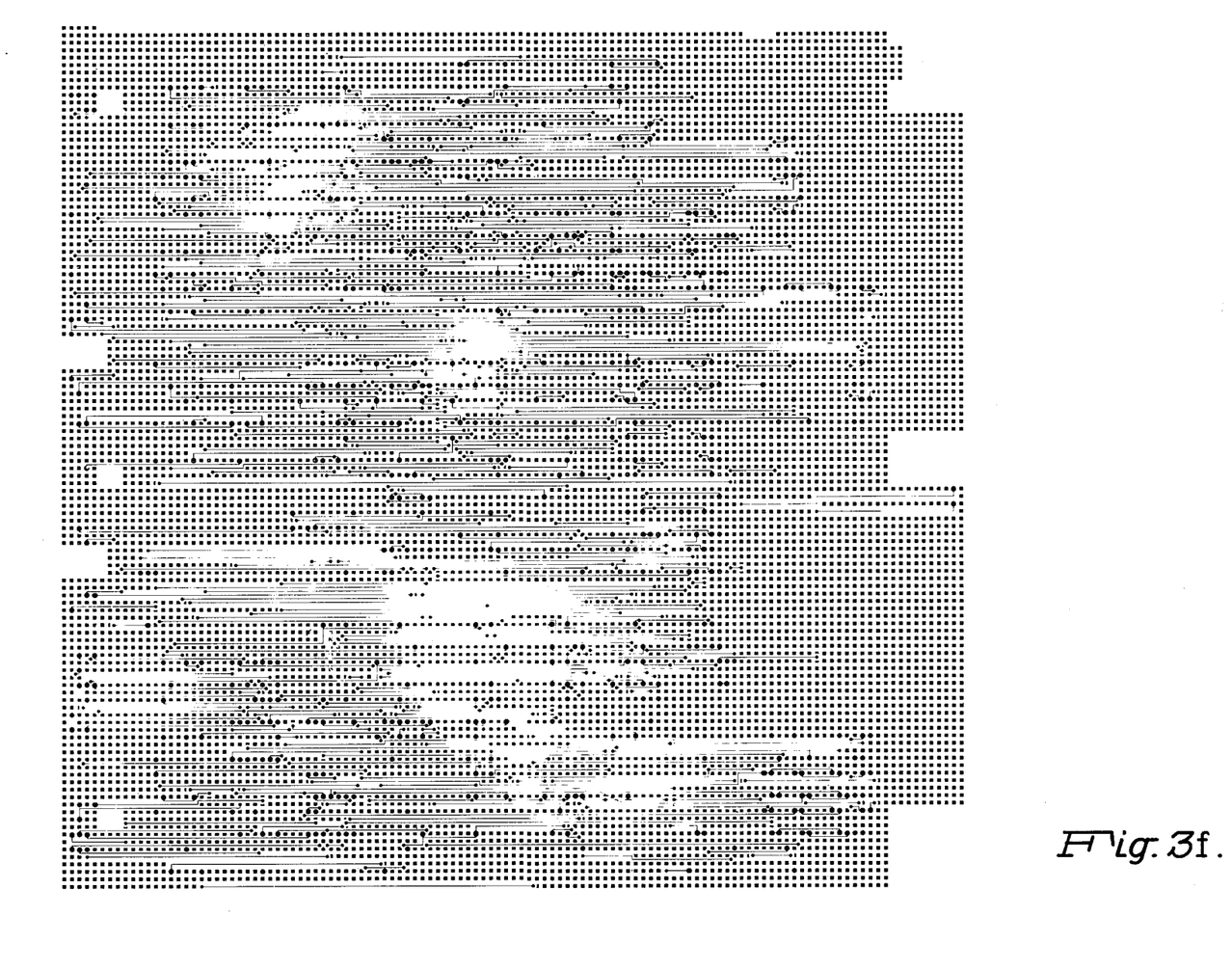
Figure 4:
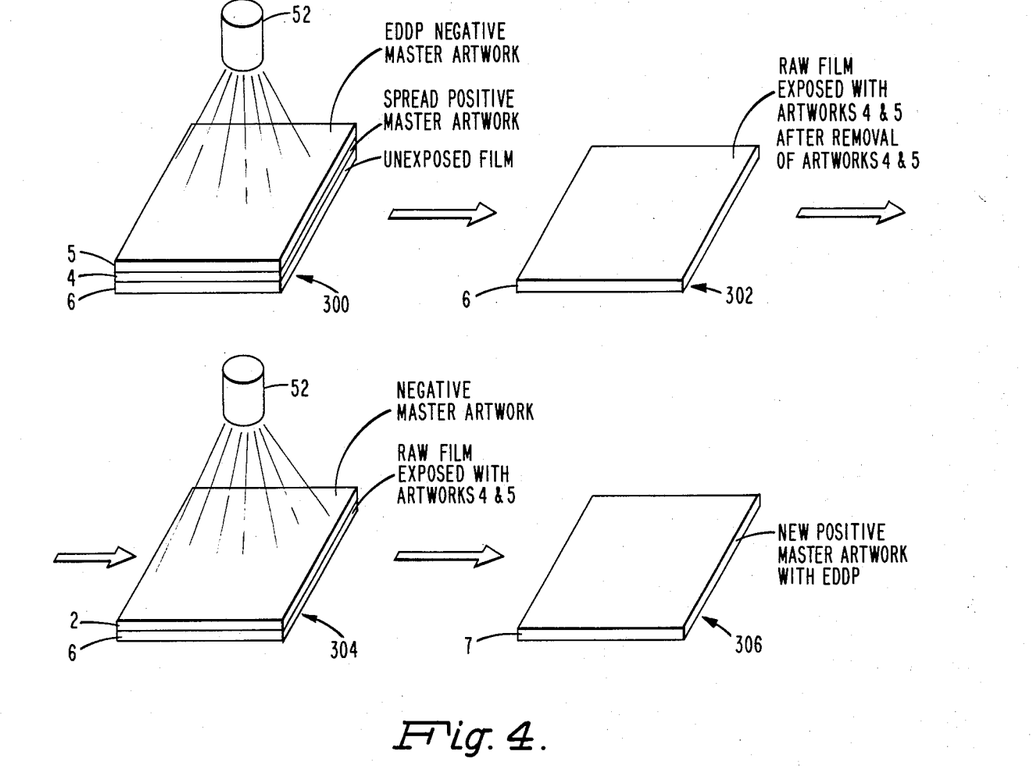
FIG. 4 shows diagrams used to illustrate in greater detail, certain photographic operations performed in FIG. 2.

As shown in FIG. 2, the positive spread master artwork of FIG. 3e (sheet 4), the EDDP negative master of FIG. 3d (sheet 5) and a sheet of unexposed mylar film (sheet 6 in FIG. 2), are punched by the equipment 40 as denoted by block 214. More specifically, in each instance, the sheets of unexposed mylar film and artwork masters are punched so as to include four registration slots. These slots enable the accurate alignment of the artworks and unexposed film during the generation of the required composites pursuant to the steps of blocks 222 through 230 of FIG. 2. In the case of the artworks, the registration slots are generated by the film punch equipment 40 using the crosshair points appearing on the artworks. The crosshair points are generated by photoplotter 24. Similar registration slots on the sheets of unexposed mylar film are generated by an equivalent fixed punch arrangement (no alignment required for unexposed imageless film).

As seen from FIG. 2, a first composite artwork is made by photographically combining the positive spread master artwork of FIG. 3e and EDDP negative master of FIG. 3d. This operation is illustrated diagramatically by block 300 of FIG. 4. As denoted in block 222, the positive spread master artwork (sheet 4), the negative EDDP master (sheet 5), and the punched unexposed sheet of mylar film (sheet 6) are placed onto pinned contact table 50. The film is exposed as denoted by block 224. The positive spread master artwork (sheet 4) and the negative EDDP master (sheet 5) are removed while the exposed film (sheet 6) is left as denoted by block 302 in FIG. 4.

Next, a further composite artwork is made by photographically combining the negative master artwork (sheet 2) with the undeveloped exposed film containing the first composite artwork (sheet 6). That is, as shown diagramatically by block 304 of FIG. 4, the negative master artwork is placed onto pinned contact frame table 50 over the undeveloped exposed film (sheet 6). The film is then exposed and developed under the control of photoequipment 52. The result is the new positive master artwork of FIG. 3f (sheet 7 in FIG. 2) which contains the equal density distribution pattern as shown by block 306.

Figure 5:
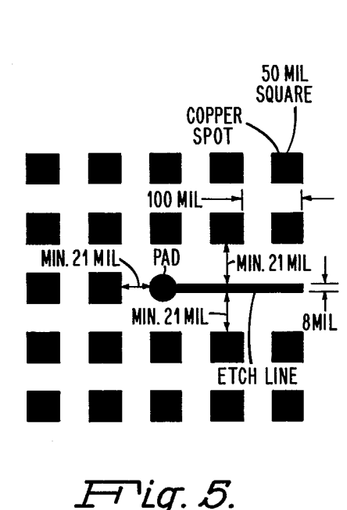
FIG. 5 shows in greater detail, the equal density distribution pattern generated in FIG. 2.

From FIG. 5, it can be seen that the resulting modified master artwork contains eight thousandths etch lines having twenty-one thousandths of clearance to any other line, pad or non-functional square spot or pad. The double exposure operation places non-functional square spots of the equal density distribution pattern in those areas not covered by circuit line patterns. At the completion of the first exposure step, the film (sheet 5) contains a space defined by the spread positive master (sheet 4) cleared from the EDDP negative master (sheet 5) for the actual master artwork circuit line patterns (i.e., eight thousandths lines and pads) on the negative master artwork (sheet 2). That is, the combination of a positive image and a negative film image eliminated the lines. The positive spread master artwork (sheet 4) blocked or restricted the light from being applied to the unexposed film (sheet 6). Thus, it left those areas still sensitive to light (unexposed).

When the negative master artwork (sheet 2) was exposed onto the pre-exposed piece of film (sheet 6), the result is a positive artwork master which contains the circuit line patterns and equal density distribution pattern. That is, the negative master artwork (sheet 2) opened up that area and allowed light to be applied to these areas exposing the circuit line image in those areas. It will be appreciated that this operation as well as the other operations which involve the processing of unexposed film are carried out under the appropriate lighting conditions (i.e., dark room environment).

The above double exposure two-step operation produces the desired modified master artwork (sheet 7). The new positive master artwork with the EDDP can now be used to fabricate new printed wiring boards using standard techniques.

While this example only illustrated modifications to a single layer or side of a PWB, changes to the remaining layers of a multilayer PWB are carried out in an identical fashion. It can be seen that as the number of board layers increase, the advantages of the system and process of the present invention become more valuable in increasing production output and in reducing cost and the time for inspection and testing.

The above has described a process which greatly reduces photoplotting and inspection time normally required. Moreover, the process of the present invention results in the production of PWB's with increased reliability at less cost.

It will be obvious to those skilled in the art that many changes may be made to the preferred embodiment of the system and process of the present invention. For example, other types of equipment may be utilized and the shape and size parameters of the equal density distribution pattern altered as required. The only requirement is that the pattern use spots whose shape differs from that of hole pads. It will also be appreciated that the process of the present invention may be used in fabricating any type of PWB utilizing any fabrication process.

While in accordance with the provisions and statutes there has been illustrated and described the best form of the invention, certain changes may be made without departing from the spirit of the invention as set forth in the appended claims and that in some cases, certain features of the invention may be used to advantage without a corresponding use of other features.

What is claimed is:

1. A method of modifying an original master artwork for eliminating non-uniform plating on a multilayer printed circuit board, said master artwork containing an image of a printed wiring pattern of at least one layer of said multilayer printed circuit board, said method comprising the steps of:
   generating a first artwork containing an exact line image of said original master artwork circuit wiring pattern;
   generating a second artwork containing a predetermined equal density distribution pattern covering the entire usable area of said board;
   generating a third master artwork from said first artwork containing said exact image of said original master artwork wiring pattern which is larger than said exact image by a predetermined amount; and,
   photographically combining different ones of said first, said second and third artworks in succession for producing a new master artwork which contains said image of said printed wiring pattern and said equal density distribution pattern.

2. The method of claim 1 wherein the step of photographically combining includes the steps of:
   photographically generating a first composite artwork by overlaying onto an unexposed sheet of film, said second artwork and said third artwork, said first composite artwork containing unexposed areas with clearance for said exact line image and said equal distribution pattern of said second artwork;
   removing said second and third artworks from said sheet of film after being exposed; and,
   photographically generating said new master artwork by overlaying onto said previously exposed sheet of film, said first artwork.

3. The method of claim 2 wherein said first photographically generating step includes the step of:
   exposing said unexposed sheet of film so as to produce a composite artwork image; and,
   said second photographically generating step includes the steps of:
   exposing the previously unexposed areas of film; and developing said double exposed sheet following the last exposure.

4. The method of claim 2 wherein said method further includes the step of:
   producing registration slots in said first, second and third master artworks and said sheet of unexposed film for enabling said artworks to be accurately aligned during each of said photographically generating steps.

5. The method of claim 4 wherein in each of said photographically generating steps, said artworks and exposed sheet of film are overlayed on a pinned frame contact table and accurately aligned by said registration slots.

6. The method of claim 4 wherein each of said steps of generating said first and second artworks includes generating a number of reference marks at predetermined points on said artworks outside an area of said image and producing registration slots at locations defined by said reference marks.

7. The method of claim 1 wherein said steps of generating said first artwork and said second artwork respectively include the steps of:
   photoplotting on sheets of unexposed film the lines representative of said printed wiring pattern and said equal density distribution pattern.

8. The method of claim 1 wherein said step of generating said third master artwork includes the step of photographically enlarging said first artwork by a predetermined amount so as to provide a desired clearance between said exact line image and said equal density distribution pattern.

9. The method of claim 8 wherein said predetermined amount approximates to 50 thousandths of an inch and said clearance approximates 21 thousandths of an inch.

10. The method of claim 1 wherein said step of generating said second artwork produces an array of spots offset from each other by a predetermined amount which corresponds to said equal density distribution pattern.

11. The method of claim 10 wherein said spots approximate 50 thousandths of an inch square and offset by approximately 100 thousandths of an inch.

12. The method of claim 11 wherein said spots approximate 50 thousandths of an inch square and offset by approximately 100 thousandths of an inch.

13. The method of claim 1 wherein said printed circuit board has a plurality of layers, and each of the steps of said method are repeated for each of said plurality of layers.

14. A method of modifying an original photographic master artwork containing an exact image of a conductor design wiring pattern which will appear on a fabricated printed wiring board, said method comprising the steps of:
generating a first negative artwork containing an equally distributed spot-like pattern with uniform density covering the entire usable area of said board; and,
generating a second positive artwork from said original photographic master artwork by enlarging said exact image by a predetermined amount; and,
successively photographically combining different ones of said original master, said first and second artworks to produce a new master artwork which contains said exact image of said conductor design pattern and said equal density distribution pattern.

15. The method of claim 14 wherein said step of photographically combining includes the steps of:
photographically generating a first composite artwork by overlaying onto an unexposed sheet of film, a negative of said original master artwork and said second positive artwork, said composite artwork on said sheet of film containing unexposed enlarged areas corresponding to said exact image of said original design conductor pattern and the remaining areas containing said equal density distribution pattern; and,
photographically generating a second composite artwork by overlaying onto said previously exposed sheet of film, said negative of said original master artwork, said second composite artwork containing said exact image of said original conductor wiring pattern within said previously unexposed enlarged areas in addition to said equal density distribution pattern.

16. The method of claim 14 wherein said first photographically generating step includes the steps of:
exposing said unexposed sheet of film so as to produce a composite artwork image; and,
said second photographically generating step includes the steps of:
exposing the previously unexposed areas of film; and developing said double exposed sheet following the last exposure.

17. The method of claim 16 wherein said method further includes the step of:
producing registration slots in said first, second and original master artworks and each of said sheets of unexposed film for enabling said artworks to be accurately aligned during said photographically generating steps.

18. The method of claim 17 wherein in each of said photographically generating steps, said artworks and unexposed sheet of film are overlayed on a pinned frame contact table and accurately aligned by said registration slots.

19. The method of claim 18 wherein said step of generating said first artwork includes generating a number of reference marks at predetermined points on said artwork outside of said image and producing registration slots at locations defined by said reference marks.

20. The method of claim 14 wherein said step of generating said first negative artwork produces an array of spots offset from each other by a predetermined amount which corresponds to said equal density distribution pattern.

21. A method of modifying original master artworks containing exact images of printed wiring patterns corresponding to the different layers of a multilayer printed circuit board, said method comprising the steps of:
(a) generating by a computer aided design system on a magnetic tape media, a first set of coded signals, including signals representative of an equal density distribution pattern;
(b) generating by said photoplotting means in response to said first set of coded signals a first artwork containing an image of said equal density distribution pattern;
(c) spreading by photographic means said exact of the wiring pattern of said first one of said original master artworks by a predetermined amount to produce a spread original master artwork; and,
(d) successively photographically combining by pinned contact frame table means, said original master, said spread original master and said first artwork for producing a new master artwork which contains said exact image of said wiring pattern of said first one of said original master artwork and said equal density distribution pattern.

22. The method of claim 21 wherein steps (b) through (d) are repeated for modifying each of the remaining original master artworks using the first set of signals generated during step (a).

23. The method of claim 21 wherein the step of photographically combining includes the steps of:
photographically generating a first composite artwork by overlaying onto an unexposed sheet of film, said second artwork and said third artwork, said first composite artwork containing unexposed areas with clearance for said exact line image and said equal distribution pattern of said second artwork;
removing said second and third artworks from said sheet of film after being exposed; and,
photographically generating said new master artwork by overlaying onto said previously exposed sheet of films, said first artwork.

* * * * *